United States Patent [19]
Mori

[11] Patent Number: 5,780,917
[45] Date of Patent: Jul. 14, 1998

[54] COMPOSITE CONTROLLED SEMICONDUCTOR DEVICE AND POWER CONVERSION DEVICE USING THE SAME

[75] Inventor: Mitsuhiro Mori, Hitachi, Japan

[73] Assignee: Hitachi, Ltd., Tokyo, Japan

[21] Appl. No.: 41,996

[22] Filed: Apr. 2, 1993

[30] Foreign Application Priority Data

Apr. 3, 1992 [JP] Japan .................. 4-081854

[51] Int. Cl.$^6$ .............. H01L 27/06; H01L 29/78
[52] U.S. Cl. ............ 257/487; 257/110; 257/121; 257/146; 257/147; 257/139; 257/141
[58] Field of Search .............. 257/487, 108, 257/109, 110, 121, 146, 147, 208, 488, 489, 139, 141

[56] References Cited

U.S. PATENT DOCUMENTS

| | | | |
|---|---|---|---|
| 3,196,330 | 7/1965 | Moyson | 257/121 |
| 3,896,476 | 7/1975 | Kawakami | 257/146 |
| 4,901,127 | 2/1990 | Chow et al. | 257/378 |
| 5,077,591 | 12/1991 | Chen et al. | 257/109 |
| 5,382,826 | 1/1995 | Mojaradi | 257/489 |

FOREIGN PATENT DOCUMENTS

| | | |
|---|---|---|
| 0083801A3 | 12/1982 | European Pat. Off. . |
| 0098496A1 | 6/1983 | European Pat. Off. . |
| A0225962 | 6/1986 | European Pat. Off. . |
| 0368246 | 5/1990 | European Pat. Off. . |
| 0416805A3 | 8/1990 | European Pat. Off. . |
| A-3804254A1 | 2/1988 | Germany . |
| 3804254 | 8/1989 | Germany ............ 257/139 |
| A-58-210677 | 12/1983 | Japan . |
| A-60-249367 | 12/1985 | Japan . |
| A-61-222260 | 10/1986 | Japan . |
| A-62-238668 | 10/1987 | Japan . |
| 3-23675 | 1/1991 | Japan . |

Primary Examiner—Tom Thomas
Assistant Examiner—Alexander Oscar Williams
Attorney, Agent, or Firm—Antonelli, Terry, Stout & Kraus, LLP

[57] ABSTRACT

In a composite controlled semiconductor device having an insulated gate, a p type semiconductor region forming no channel is provided between a plurality of p type semiconductor regions forming a channel and the potential of the p type semiconductor region in an ON state takes a value high enough to inject holes into an n type semiconductor region adjacent to the p type semiconductor region.

16 Claims, 8 Drawing Sheets

F I G. 1
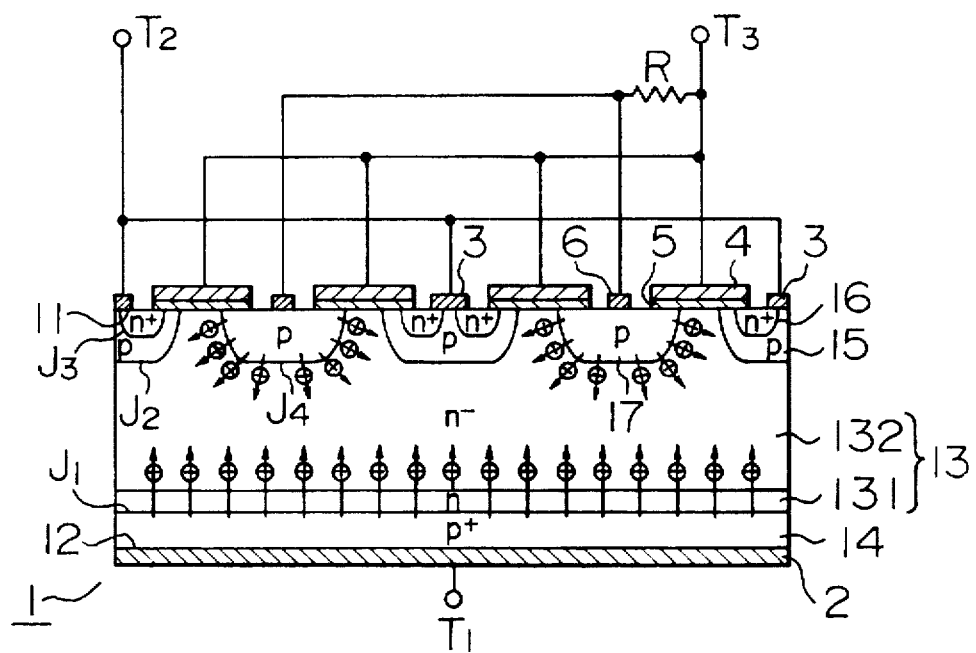
F I G. 2
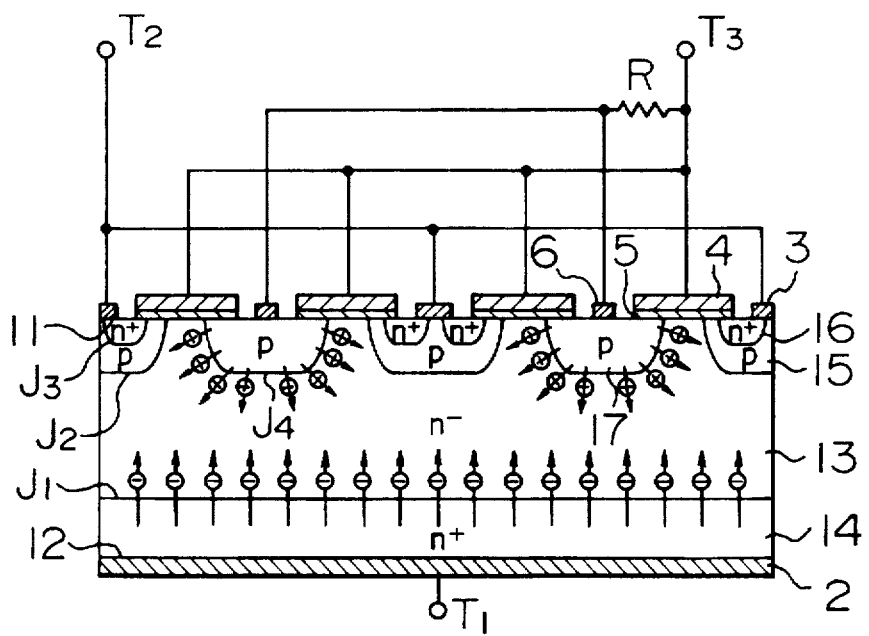

COMPOSITE CONTROLLED SEMICONDUCTOR DEVICE AND POWER CONVERSION DEVICE USING THE SAME

BACKGROUND OF THE INVENTION

The present invention relates to a novel composite controlled semiconductor device controlled by a voltage and a current and a power conversion device using such a semiconductor device, and more particularly to the structure of a composite controlled semiconductor device which is effective for the reduction of a loss in an ON state, the prevention of parasitic devices from operating and the reduction of an electric power for control.

Recently, IGBT's (or insulated gate bipolar transistors) have widely been used in place of GTO's (or gate turn-off thyristors) and MOSFET's (or power MOS transistors). The reason is that an ON/OFF control of the IGBT is easy as compared with that of the GTO since the IGBT is of a voltage controlled type and that an ON-state voltage of the IGBT is low as compared with that of the MOSFET since the IGBT is of a conductivity modulated type.

The IGBT includes, for example, a semiconductor body composed of an n layer epitaxially grown on a $p^+$ substrate, an $n^-$ layer formed on the n layer, a plurality of p layers regularly formed in the $n^-$ layer to expose an upper surface of the $n^-$ layer and an $n^+$ layer provided in each p layer to expose an upper surface of the p layer, a collector electrode provided in ohmic contact with the $p^+$ substrate, an emitter electrode provided in ohmic contact with the $n^+$ layer and the p layer, and a gate electrode provided on an exposed surface of the $n^-$ layer through an insulating film.

In the case where the IGBT having such a construction is used with the requirements in which a high withstand voltage is imposed, it is required that the $n^-$ layer be a relatively thick region, in which a depletion layer dominantly extends. As the $n^-$ layer is made thicker, a significant problem arises in which conductivity modulation develops in an area of the $n^-$ layer near the $p^+$ substrate which makes it more difficult for such modulation to take place in an area farther from the $p^+$ substrate, thereby disabling the best use of the IGBT's feature of low ON-state voltage. A known scheme for solving this problem, is to provide a hole injecting p layer in an exposed surface of the $n^-$ layer on the emitter electrode side (see JP-A-3-23675).

The JP-A-3-23675 has disclosed a structure, as shown in FIG. 14, in which a p layer 214 is formed in a periphery portion of a semiconductor body and an electrode 223 in contact with the p layer 214 is connected to a gate electrode terminal G to supply a positive gate potential so that positive holes are injected from the p layer 214 into an $n^-$ layer 213. However, since the p layer 214 is provided in the periphery portion of the semiconductor body, positive holes injected from the p layer 214 scarcely reach a center portion of the semiconductor body of a several-millimeter square chip. That is, most of the positive holes are absorbed by a p layer 215 nearest to the p layer 214, thereby resulting in substantially no contribution to the reduction of an ON-state voltage. Especially, in a high-withstand voltage IGBT used at a voltage higher than 1000 V, a high conductivity modulation over the entire area is desired since the $n^-$ layer 213 becomes thicker than 100 microns.

Also, the IGBT shown in FIG. 14 has the following inconvenience. Namely, the gate electrode terminal G connected to the electrode 223 takes a voltage of about 15 V in an ON state. A potential relationship between a collector electrode 221 and an emitter electrode 222 of the IGBT in the ON state is such that the emitter electrode 222 takes a grounded potential and a low voltage of about 3 V is applied to the electrode 221. As the potential of the electrode 223 on the ON state becomes higher than that of the collector electrode 221, a pn junction between a $p^+$ substrate 211 and an n layer 212 is reversely biased so that a large current flows from the p layer 214 into an $n^+$ layer 216, thereby making a gate control difficult. In attempting to effect gate control of the IGBT, there arises a problem that a large electric power is required for the gate control.

Further, there is an inconvenience that a parasitic thyristor in a lateral direction including the p layer 214, the $n^-$ layer 213, the p layer 215 and the $n^+$ layer 216 and a parasitic thyristor in a vertical direction including the $p^+$ substrate 211, the n layer 212, the $n^-$ layer 213, the p layer 215 and the $n^+$ layer 216 operate due to a large amount of positive holes injected from the p layer 214 and hence a control by an insulated gate including an insulating film 231 and an electrode 232 becomes difficult, thereby resulting in the breakage of the IGBT chip.

In addition, since a current density at the periphery portion of the semiconductor body is high and hence the amount of heat generated is large at the periphery portion, there is a problem that in the case where the collector electrode 221 is solder-secured to a heat sink which forms a part of a package, a strain stress of the periphery portion of the semiconductor body having the largest strain is further increased so that the IGBT chip is broken or becomes liable to peel off from the package even in the case where it is not broken.

SUMMARY OF THE INVENTION

An object of the present invention is to provide an improved composite controlled semiconductor device which has a high withstand voltage and requires a low ON-state voltage.

Another object of the present invention is to provide an improved composite controlled semiconductor device in which a large output current is obtained, breakage (breakdown) of the device caused by parasitic thyristors does not take place and the loss of an electric power for gate control is small.

A further object of the present invention is to provide a power conversion device using the improved composite controlled semiconductor device.

Other objects of the present invention will become apparent when reading the following description of embodiments.

According to one aspect of the present invention, there is provided a composite controlled semiconductor device comprising a semiconductor body which has a pair of principal surfaces and which includes a first semiconductor layer of a first conductivity type adjoining one of the principal surfaces, a second semiconductor layer adjoining the first semiconductor layer and the other of the principal surfaces and having a higher impurity concentration than the first semiconductor layer, a plurality of third semiconductor layers of a second conductivity type extending from the one principal surface into the first semiconductor layer and having a higher impurity concentration than the first semiconductor layer, a plurality of fourth semiconductor layers of the first conductivity type extending from the one principal surface into the third semiconductor layers and having a higher impurity concentration than the third semiconductor layers, and a plurality of fifth semiconductor layers of the second conductivity type each positioned between the third semiconductor layers, extending from the one principal surface into the first semiconductor layer and having a higher impurity concentration than the first semiconductor layer; a first main electrode provided in ohmic contact with an exposed surface of the second semiconductor layer; a second main electrode provided in ohmic contact with exposed surfaces of the third semiconductor layers and the fourth semiconductor layers; a control electrode provided through an insulating film on exposed surfaces of the first semiconductor layer, the third semiconductor layers and the fourth semiconductor layers, and an auxiliary electrode provided in ohmic contact with an exposed surface of the fifth semiconductor layer and connected to either the second main electrode or the control electrode through current limiting means(or current limiter), wherein in an ON state, a potential having a polarity for forwardly biasing each junction between the third semiconductor layers and the fourth semiconductor layers is applied between the first main electrode and the second main electrode, a potential having a polarity and a value high enough to form a channel region in a surface of the third semiconductor layers just under the control electrode is applied between the second main electrode and the control electrode, a potential having a polarity for forwardly biasing a junction between the fifth semiconductor layer and the first semiconductor layer is applied between the second main electrode and the auxiliary electrode, and a potential having a polarity for forwardly biasing a junction between the first semiconductor layer and the second semiconductor layer is applied between the first main electrode and the auxiliary electrode. The conductivity type of the second semiconductor layer is selected to be that of the first conductivity type in the case where the composite controlled semiconductor device is used as an IGBT and that of the second conductivity type in the case where the composite controlled semiconductor device is used as an MOSFET.

According to another aspect of the present invention, there is provided a composite controlled semiconductor device comprising a semiconductor body including a first semiconductor layer of a first conductivity type, a second semiconductor layer extending from a surface of the first semiconductor layer into the first semiconductor layer and having a higher impurity concentration than the first semiconductor layer, a third semiconductor layer of a second conductivity type positioned apart from the second semiconductor layer, extending from the surface of the first semiconductor layer into the first semiconductor layer and having a higher impurity concentration than the first semiconductor layer, fourth semiconductor layers of the first conductivity type each extending from a surface of the third semiconductor layer into the third semiconductor layer and having a higher impurity concentration than the third semiconductor layer, and fifth semiconductor layers of the second conductivity type each positioned between the second semiconductor layer and the third semiconductor layer, extending from the surface of the first semiconductor layer into the first semiconductor layer and having a higher impurity concentration than the first semiconductor layer; a first main electrode provided in ohmic contact with an exposed surface of the second semiconductor layer; a second main electrode provided in ohmic contact with exposed surfaces of the third semiconductor layer and the fourth semiconductor layer; a control electrode provided through an insulating film on exposed surfaces of the first semiconductor layer, the third semiconductor layer and the fourth semiconductor layers; and an auxiliary electrode provided in ohmic contact with an exposed surface of the fifth semiconductor layers and connected to either the second main electrode or the control electrode through current limiting means (or current limiter), wherein in an ON state, a potential having a polarity for forwardly biasing each junction between the third semiconductor layer and the fourth semiconductor layers is applied between the first main electrode and the second main electrode, a potential having a polarity and a value high enough to form a channel region in a surface of the third semiconductor layer just under the control electrode is applied between the second main electrode and the control electrode, a potential having a polarity for forwardly biasing each junction between the fifth semiconductor layers and the first semiconductor layer is applied between the second main electrode and the auxiliary electrode, and a potential having a polarity for forwardly biasing a junction between the first semiconductor layer and the second semiconductor layer is applied between the first main electrode and the auxiliary electrode. The conductivity type of the second semiconductor layer is selected to be that of the second conductivity type in the case where the composite controlled semiconductor device is used as an IGBT and the first conductivity type in the case where the composite controlled semiconductor device is used as an MOSFET.

According to a further aspect of the present invention a power conversion device comprising a pair of DC terminals, AC terminals the number of which is the same as the number of phases of AC outputs, and inverter units the number of which is the same as the number of phases of AC outputs, which are connected between the pair of DC terminals and each of which includes two series-connected parallel circuits each having a switching element and a diode with a reverse polarity, the junction points of the parallel circuits being connected to the different AC terminals, the switching element including the composite controlled semiconductor device as mentioned above.

In the composite controlled semiconductor device of the present invention, the fifth semiconductor layer is provided between the third semiconductor layers and apart from the third semiconductor layer. Also, in an ON state, a potential having a polarity for forwardly biasing each junction between the third semiconductor layer and the fourth semiconductor layers is applied between the first main electrode and the second main electrode, a potential having a polarity and a value high enough to form a channel region in a surface of the third semiconductor layer just under the control electrode is applied between the second main electrode and the control electrode, a potential having a polarity for forwardly biasing a junction between the fifth semiconductor layer and the first semiconductor layer is applied between the second main electrode and the auxiliary electrode, and a potential having a polarity for forwardly biasing a junction between the first semiconductor layer and the second semiconductor layer is applied between the first main electrode and the auxiliary electrode. Therefore, it is possible to inject carriers from the second semiconductor layer and the third semiconductor layer into the first semiconductor layer in an ON state so that a conductivity modulation takes place over the entire area of the first semiconductor layer in a current conducting direction, thereby flowing a large current, reducing an ON-state voltage and preventing a breakage (breakdown) caused by parasitic thyristors. As a result, it is possible to realize a composite controlled semiconductor device which has a high withstand voltage and a reduced power loss. Also, if it is assumed that a loss caused by an ON-state voltage is the same as that of the conventional device, it is possible to greatly increase an output current.

In the power conversion device of the present invention, the above-mentioned composite controlled semiconductor device having a high withstand voltage and a reduced power loss is used as a switching element. Therefore, it is possible to realize a power conversion device which has a high efficiency and a small size.

BRIEF DESCRIPTION OF THE DRAWINGS

FIG. 1 is a cross-sectional view schematically showing an embodiment in the case where the present invention is applied to an IGBT;

FIG. 2 is a cross-sectional view schematically showing an embodiment in the case where the present invention is applied to an MOSFET;

DESCRIPTION OF THE PREFERRED EMBODIMENTS

Figure 3:
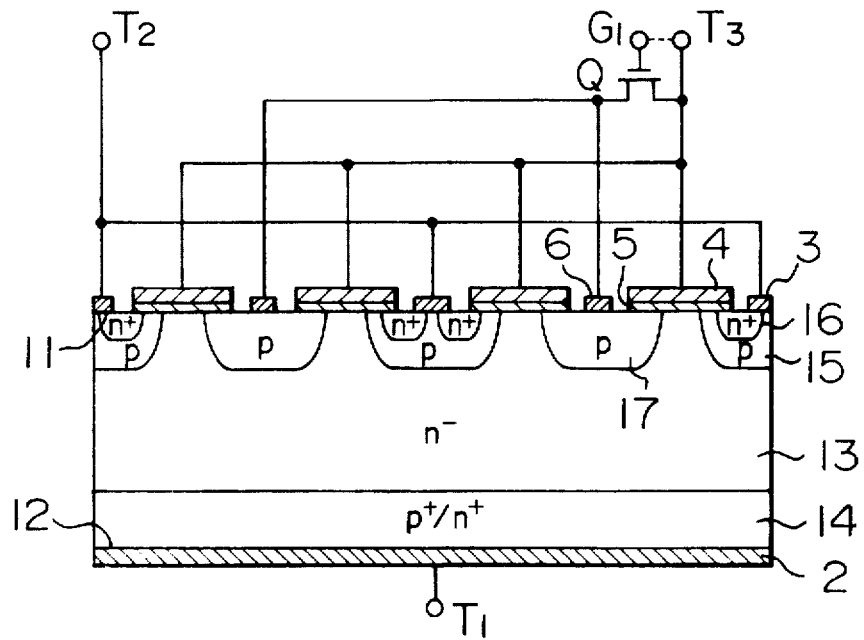
FIG. 3 is a cross-sectional view schematically showing another embodiment of a composite controlled semiconductor device of the present invention.

Embodiments of a composite controlled semiconductor device of the present invention and a power conversion device using the same will now be explained in detail by use of the drawings.

FIG. 1 shows an embodiment in the case where a composite controlled semiconductor device of the present invention is applied to an IGBT. In FIG. 1, reference numeral 1 designates a semiconductor body which has a pair of principal surfaces 11 and 12 and includes between the principal surfaces a first semiconductor layer 13 of n type adjoining the one surface 11, a second semiconductor layer 14 of p type adjoining the first semiconductor layer 13 and the other principal surface 12 and having a higher impurity concentration than the first semiconductor layer 13, a plurality of third semiconductor layers 15 of p type extending from the one principal surface 11 into the first semiconductor layer 13 and having a higher impurity concentration than the first semiconductor layer 13, a plurality of fourth semiconductor layers 16 of n type extending from the one principal surface 11 into the third semiconductor layers 15 and having a higher impurity concentration than the third semiconductor layer 15, and a plurality of fifth semiconductor layers 17 of p type each positioned between the third semiconductor layers 15, extending from the one principal surface 11 into the first semiconductor layer 13 and having a higher impurity concentration than the first semiconductor layer 13. The first semiconductor layer 13 is composed of a first layer portion 131 adjoining the second semiconductor layer 14 and a second layer portion 132 having a lower impurity concentration than the first layer portion 131 and adjoining the third semiconductor layers 15. When seen in a certain cross section, two fourth semiconductor layers 16 are formed in one third semiconductor layer 15. Reference symbol $J_1$ designates a first junction formed between the first layer portion 131 of the first semiconductor layer 13 and the second semiconductor layer 14, symbol $J_2$ a second junction formed between the second layer portion 132 of the first semiconductor layer 13 and each of the third semiconductor layers 15, symbol $J_3$ a third junction formed between each third semiconductor layer 15 and the fourth semiconductor layer 16 corresponding thereto, and symbol $J_4$ a fourth junction formed between the first semiconductor layer 13 and the fifth semiconductor layer 14. Each of these junctions is a pn junction. Numeral 2 designates a first main electrode provided in ohmic contact with the second semiconductor layer 14 on the side of the other principal surface 12 of the semiconductor body 1, numeral 3 a second main electrode provided in ohmic contact with the third semiconductor layers 15 and the fourth semiconductor layers 16 on the side of the one principal surface 11 of the semiconductor body 1, numeral 4 a control electrode provided through an insulating film 5 on the first semiconductor layers 13, the third semiconductor layer 15 and the fourth semiconductor layers 16 on the side of the one principal surface 11 of the semiconductor body 1, numeral 6 an auxiliary electrode provided in ohmic contact with the fifth semiconductor layer 17 on the side of the one principal surface 11 of the semiconductor body 1, symbol $T_1$ a first terminal connected to the first main electrode 2, symbol $T_2$ a second terminal connected to the second main electrode 3, symbol $T_3$ a third terminal connected to the control electrode 4, and symbol R a resistor connected between the auxiliary electrode 6 and the third terminal $T_3$.

In order to bring an IGBT with such a construction into an ON state, for example, in the case where the second terminal $T_2$ takes an earth potential, a positive potential is applied to the third terminal $T_3$ in a state in which a positive potential is applied to the first terminal $T_1$. Thereby, an inverted layer (or a channel) is formed in a surface of the third semiconductor layers 15 under the insulating film 5 of the control electrode 4 so that an electron current flows from the second main electrode 3 into the second semiconductor layer 14 and the fifth semiconductor layer 17 through the fourth semiconductor layers 16, the inverted layer and the first semiconductor layer 13. Namely, the IGBT is brought into the ON state. This electron current makes it possible to inject a large amount of positive holes into the first semiconductor layer 13 from the second semiconductor layer 14 on the first main electrode 2 side having a positive potential and the fifth semiconductor layer 17 on the control electrode 4 side having a positive potential so that the first semiconductor layer 13 is conductivity-modulated, thereby lowering an ON-state voltage.

In order to expect the above operation, it is necessary to satisfy the condition that in an ON state, a potential having a polarity for forwardly biasing the junction $J_3$ between each third semiconductor layer 15 and the corresponding fourth semiconductor layer 16 is applied between the first main electrode 2 and the second main electrode 3, a potential having a polarity and a value high enough to form a channel region in the surface of each of the third semiconductor layers 15 just under the control electrode 4 is applied between the second main electrode 3 and the control electrode 4, a potential having a polarity for forwardly biasing the junction $J_4$ between the fifth semiconductor layer 17 and the first semiconductor layer 13 is applied between the second main electrode 3 and the auxiliary electrode 6, and a potential having a polarity for forwardly biasing the junction $J_1$ between the first semiconductor layer 13 and the second semiconductor layer 14 is applied between the first main electrode 2 and the auxiliary electrode 6.

In the IGBT provided with the construction and the biasing condition as mentioned above, it is possible to conductivity-modulate not only the second semiconductor layer 14 side of the first semiconductor layer 13 but also the one principal surface 11 side thereof, unlike the conventional IGBT. Further, by regularly providing the fifth semiconductor layer 17 in a common conducting area portion between the third semiconductor layers 15, it is possible to conductivity-modulate the whole of the semiconductor body uniformly and over the entire area of the first semiconductor layer 13. Accordingly, it is possible to make an ON-state voltage remarkably low as compared with the conventional IGBT, thereby greatly reducing the loss. It is possible to flow a larger current if a loss caused by the ON-state voltage is the same. Especially, in a high-withstand voltage IGBT with a withstand voltage higher than 1000 V in which the thickness of the first semiconductor layer 13 is greater than 100 microns, the one principal surface 11 side of the first semiconductor layer 13 is hard to be conductivity-modulated. Therefore, the effect of the present invention becomes larger as the thickness of the first semiconductor layer 13 is greater than 100 microns and becomes greater. The present inventor has confirmed that in the case of a device having a withstand voltage of 2000 V, an ON-state voltage, which was 4 to 5 V in the conventional structure, can be reduced to half or 1.5 to 2.0 V by applying the present invention.

Regarding the present embodiment, it should be noted that since there is the injection of positive holes from the fifth semiconductor layer 17 into the first semiconductor layer 13 unlike the conventional IGBT, a parasitic thyristor including the second semiconductor layer 14, the first semiconductor layer 13, the third semiconductor layers 15 and the fourth semiconductor layers 16 and a parasitic thyristor including the fifth semiconductor layer 17, the first semiconductor layer 13, the third semiconductor layers 15 and the fourth semiconductor layers 16 become liable to operate. In the present embodiment, however, this problem is solved by interposing the resistor R between the control electrode 4 and the auxiliary electrode 6. The resistor R limits a current flowing from the third terminal $T_3$ into the auxiliary electrode 6 side so that the injection of positive holes from the fifth semiconductor layer 17 into the first semiconductor layer 13 is limited to a value at which the parasitic thyristor operation can be suppressed. Namely, the prevention of the parasitic thyristors from operating is enabled by determining a resistance value of the resistor R so that the sum of a forward current gain of a pnp transistor including the second semiconductor layer 14, the first semiconductor layer 13 and the third semiconductor layers 15, a forward current gain of a pnp transistor including the fifth semiconductor layer 17, the first semiconductor layer 13 and the third semiconductor layers 15 and a forward current gain of an npn transistor including the fourth semiconductor layers 16, the third semiconductor layers 15 and the first semiconductor layer 13 becomes smaller than 1. For example, when a voltage of 15 V is applied to the third terminal $T_3$, the potential of the auxiliary electrode 6 can be reduced to the order of 1 V to 3 V by interposing the resistor R, thereby making it possible to suppress the excess injection of positive holes which brings about the breakage of the IGBT. Further, the current supply from the third terminal $T_3$ can remarkably be reduced, thereby allowing the reduction in power loss and the simplification of a control circuit. It is needless to say that the reduction of a short-circuit resistance of the second main electrode 3 by scaling down the fourth semiconductor layers 16 or forming a high impurity concentration region in a portion of each of the third semiconductor layers 15 below the fourth semiconductor layer 16 is effective in order to minimize the forward current gain of the npn transistor including the fourth semiconductor layer 16, the third semiconductor layer 15 and the first semiconductor layer 13. In order to suppress the injection of positive holes from the fifth semiconductor layer 17, a region similar to the first layer portion 131 of the first semiconductor layer 13 may be formed around the fifth semiconductor layer 17 with a higher carrier concentration than the second layer portion 132 of the first semiconductor layer 13 and in an extent where the withstand voltage is not lowered. The formation of such a region is effective for a control of the forward current gain of the pnp transistor which includes the fifth semiconductor layer 17, the first semiconductor layer 13 and the third semiconductor layer 15.

In FIG. 1, one resistor R is interposed between the control electrode 4 and the auxiliary electrodes connected to each other. However, the resistor may be interposed between each auxiliary electrode 6 and the control electrode 4. Thereby, it is possible to uniformly distribute currents injected from the respective fifth semiconductor layers 17 and it is therefore possible to prevent a localized current concentration. Accordingly, a localized parasitic thyristor operation associated with the current non-uniformity can be prevented, thereby making it possible to ensure a safe IGBT operation. The resistor R may be provided in an integrated form by using a resistor formed or laminated on the upper surface of the semiconductor body (or substrate) or polycrystalline silicon used for the control electrode 4.

FIG. 2 shows an embodiment in the case where a composite controlled semiconductor device of the present invention is applied to an MOSFET. The embodiment of FIG. 2 is different from the embodiment of FIG. 1 in that the second semiconductor layer 14 is of an n type and the first junction $J_1$ is not a pn junction. In order to bring this MOSFET into an ON state, for example, in the case where the second terminal $T_2$ takes an earth potential, a positive potential is applied to the third terminal $T_3$ in a state in which a positive potential is applied to the first terminal $T_1$. An inverted layer (or a channel) is formed in a surface of each of the third semiconductor layers 15 under the insulating film 5 of the control electrode 4 so that an electron current flows from the second main electrode 3 into the second semiconductor layer 14 and the fifth semiconductor layer 17 through the fourth semiconductor layers 16, the inverted layer and the first semiconductor layer 13. This electron current injects positive holes into the first semiconductor layers 13 from the fifth semiconductor layers 17 on the auxiliary electrode 6 side having a positive potential. At this time, in the device of the present embodiment, the potential of the auxiliary electrode 6 is controlled by the resistor R so that the auxiliary electrode 6 takes a higher potential than the first main electrode 2 or the pn junction $J_4$ between the fifth semiconductor layer 17 and the first semiconductor layer 13 is forwardly biased. As a result, a large amount of positive holes are flown into the second semiconductor layer 14 also and these positive holes cause a large amount of electrons to inject from the second semiconductor layer 14 to the first semiconductor layer 13. Therefore, a conductivity modulation takes place over both the upper and lower regions of the first semiconductor layer 13, thereby making it possible to make an ON-state voltage remarkably small. If a loss caused by the ON-state voltage is the same as that in the conventional device, it is possible to flow a larger current. In the embodiment shown in FIG. 2, there is no voltage drop associated with the forward bias of the first pn junction $J_1$ in the embodiment shown in FIG. 1. Therefore, the present embodiment has a feature that an internal loss is small. Thus, in the MOSFET to which the composite controlled semiconductor device is applied, not only the upper region of the first semiconductor layer 13 but also the lower region thereof can be conductivity-modulated, unlike the conventional power MOSFET. Further, by regularly providing the third semiconductor layers 15 and the fifth semiconductor layers 17 in a conducting area portion, it is possible to conductivity-modulate the whole of the device uniformly and over the entire area of the first semiconductor layer 13. Accordingly, an ON-state voltage is reduced.

Further, since there are the injection of positive holes from the fifth semiconductor layer 17 as well as a positive-hole current generated by electrons injected from the second semiconductor layer 14 unlike the conventional power MOSFET, a parasitic thyristor including the fifth semiconductor layer 17, the first semiconductor layer 13, the third semiconductor layer 15 and the fourth semiconductor layer 16 becomes liable to operate. However, the operation of the parasitic thyristor can be prevented by limiting a current from the third terminal $T_3$ by the resistor R in an extent where the forwardly biased states of the fifth semiconductor layer 17 and the first semiconductor layer 13 are deteriorated. Namely, an operation free of the breakage of the device becomes possible by controlling the resistor R so that the sum of a forward current gain of a pnp transistor including the fifth semiconductor layer 17, the first semiconductor layer 13 and the third semiconductor layer 15 and a forward current gain of an npn transistor including the fourth semiconductor layer 16, the third semiconductor layer 15 and the first semiconductor layer 13 becomes smaller than 1. For example, when a voltage of 15 V is applied to the third terminal $T_3$, the potential of the auxiliary electrode 6 can be reduced to the order of 1.5 V to 3 V by interposing the resistor R, thereby making it possible to suppress the excess injection of positive holes which brings about the breakage of the device. Thereby, the excess injection of electrons from the second semiconductor layer 14 can also be suppressed. Further, the current supply from the third terminal $T_3$ can remarkably be reduced, thereby allowing the simplification of a control circuit. At this time, the potential of the first main electrode 2 is lower than 1 V. Namely, in spite of a high-withstand voltage power device, the internal loss of the device can be made lower than that of a pn diode or thyristor. It is of course that the uniform current distribution in the device and hence the prevention of localized generation of parasitic thyristors can be attained by providing the resistor for each unit cell as mentioned in conjunction with FIG. 1.

FIG. 3 shows another embodiment of a composite controlled semiconductor device of the present invention in which a transistor Q is used in place of the resistor R. Using the characteristic of the transistor that a current of the transistor Q (or an MOSFET in FIG. 3) is limited and saturated by a voltage applied to a gate G1 of the transistor, the injection of positive holes from the fifth semiconductor layer 17 is controlled so that the sum of forward current gains of respective parasitic transistors becomes smaller than 1. In the present embodiment, even if the potential of the auxiliary electrode 6 has a small variation so that a voltage applied to the gateG1 of the transistor Q involves a variation, a current supplied to the auxiliary electrode 6 is kept substantially constant and hence the injection of positive holes from the fifth semiconductor layer 17 is constantly limited, thereby enabling the remarkably stable prevention of parasitic thyristors from operating. It is of course that the gateG1 and the third terminal $T_3$ may be connected for simultaneous control.

Figure 4:
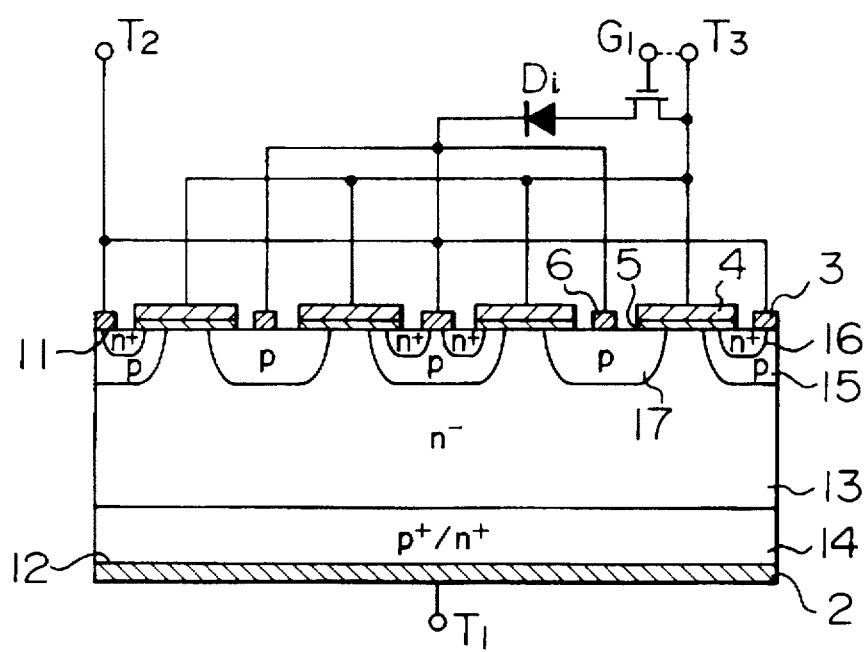
FIG. 4 is a cross-sectional view schematically showing a further embodiment of a composite controlled semiconductor device of the present invention.

FIG. 4 shows a further embodiment of a composite controlled semiconductor device of the present invention. The present embodiment is characterized in that a diode Di is connected between the transistor Q and the auxiliary electrode 6 shown in FIG. 3. With this embodiment, since a current can be prevented from flowing from the second terminal $T_2$ into the third terminal $T_3$ the potential of which is generally lower than that of the second terminal $T_2$ in an OFF state, there is provided an effect that an electric power for gate control can be reduced.

Figure 5:
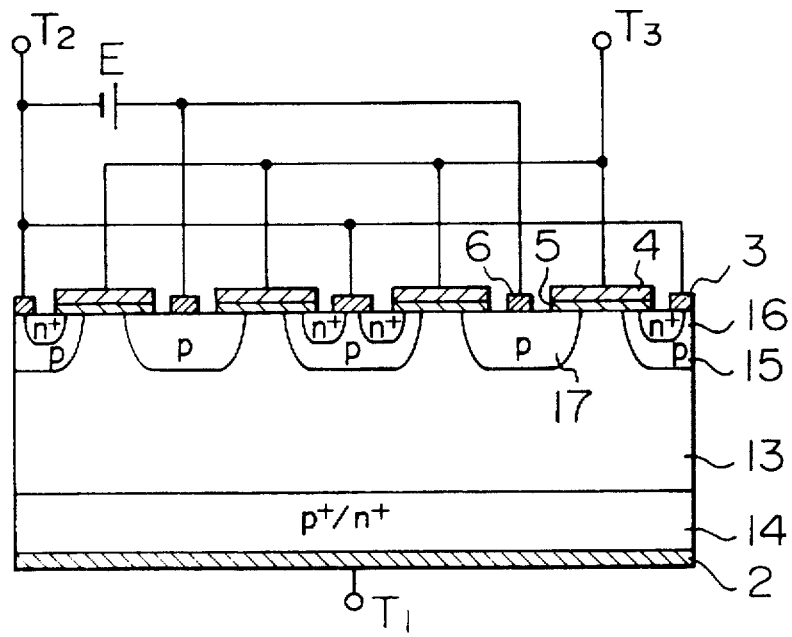
FIG. 5 is a cross-sectional view schematically showing a still further embodiment of a composite controlled semiconductor device of the present invention.

FIG. 5 shows a still further embodiment of a composite controlled semiconductor device of the present invention. In the present embodiment, instead of using the resistor R, a DC power supply E is inserted between the second terminal $T_2$ and the auxiliary electrode 6 so that the auxiliary electrode 6 side of the power supply E is positive. With this embodiment, since a current supplied from the auxiliary electrode 6 and the potential of the auxiliary electrode 6 can be controlled independently from the potential of the third terminal $T_3$, there is provided an effect that it becomes easy to implement the realization of a large-current device and the prevention of a parasitic thyristor operation in consistency with each other.

Figure 6:
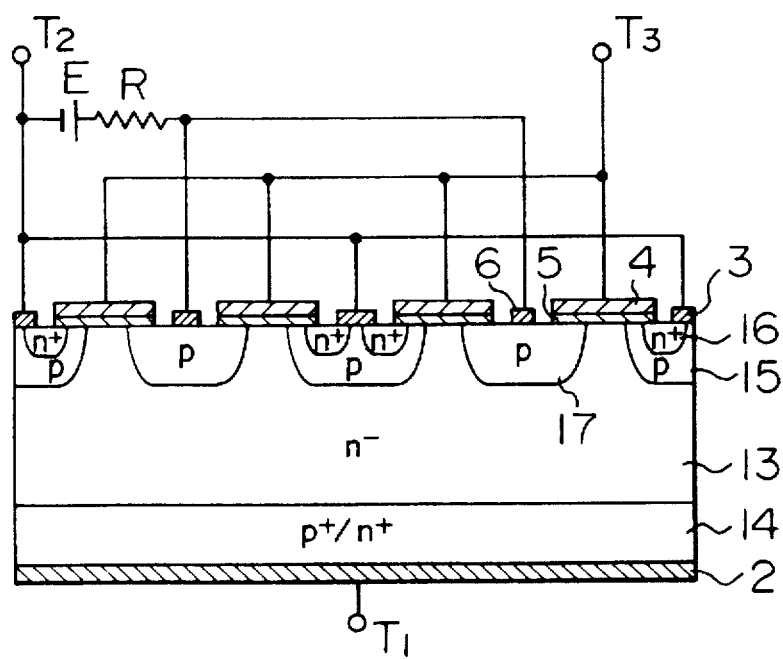
FIG. 6 is a cross-sectional view schematically showing a first modification of the embodiment shown in FIG. 5.
Figure 7:
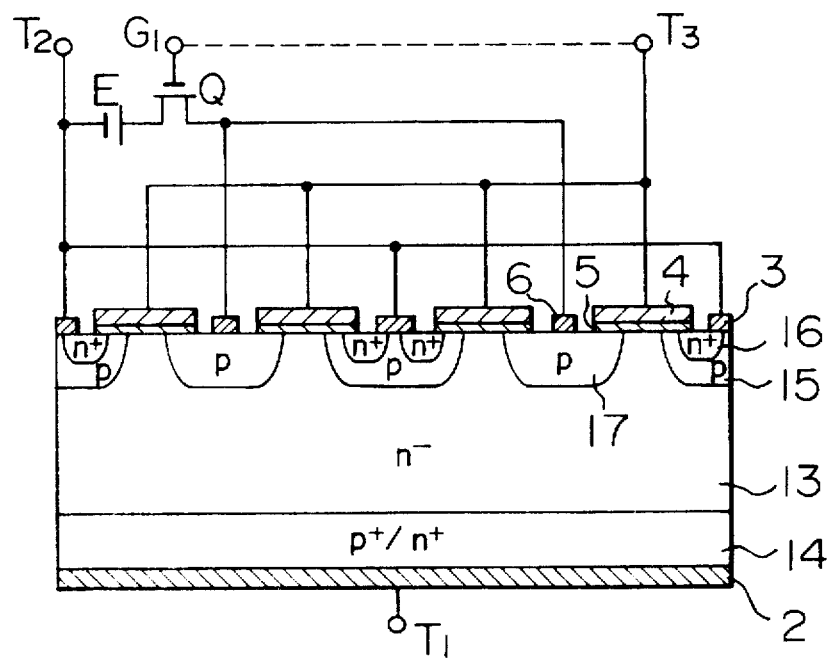
FIG. 7 is a cross-sectional view schematically showing a second modification of the embodiment shown in FIG. 5.
Figure 8:
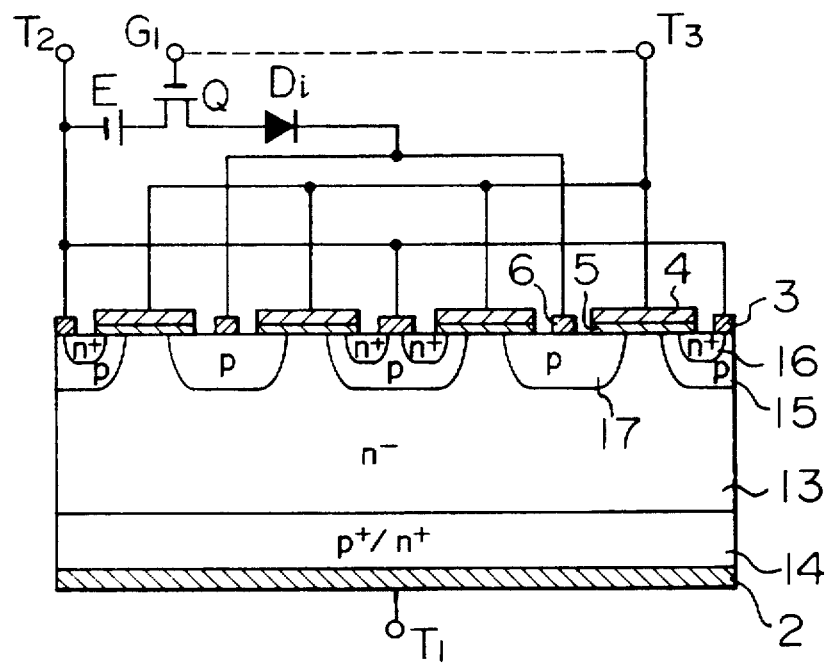
FIG. 8 is a cross-sectional view schematically showing a third modification of the embodiment shown in FIG. 5.

FIGS. 6, 7 and 8 show modifications of the embodiment shown in FIG. 5. The modifications shown in FIGS. 6, 7 and 8 are characterized in that a resistor R, a transistor Q and a series circuit of a transistor Q and a diode Di are respectively inserted in series with the DC power supply E. These modifications have the effects of the embodiments of FIGS. 2, 3 and 4 when compared with the embodiment of FIG. 5.

Figure 9:
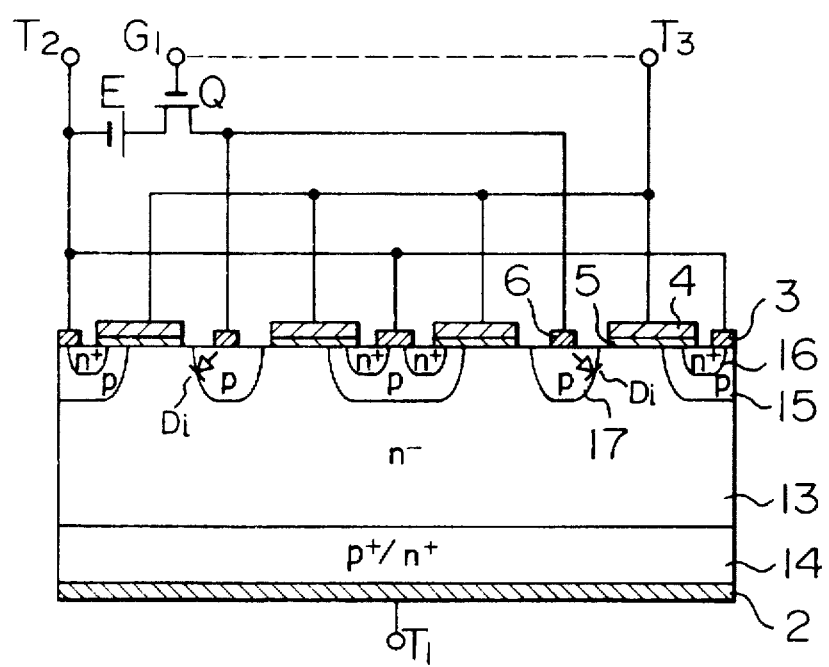
FIG. 9 is a cross-sectional view schematically showing a modification of the embodiment shown in FIG. 8.

FIG. 9 shows a modification of the embodiment shown in FIG. 8. This modification is characterized in that a diode Di is integrated in a semiconductor body 1. The structure of FIG. 9 is different from the structure of FIG. 8 in that a control electrode does not cover or extend to the fifth semiconductor layer 17. Thereby, there is no fear that the third semiconductor layer 15 and the fifth semiconductor layer 17 may be shortcircuited by the control electrode 4 when the third terminal $T_3$ is reversely biased. In the present modification too, the gate electrodeG1 and the third terminal $T_3$ can be connected to provide an effect that a control is facilitated.

Figure 10:
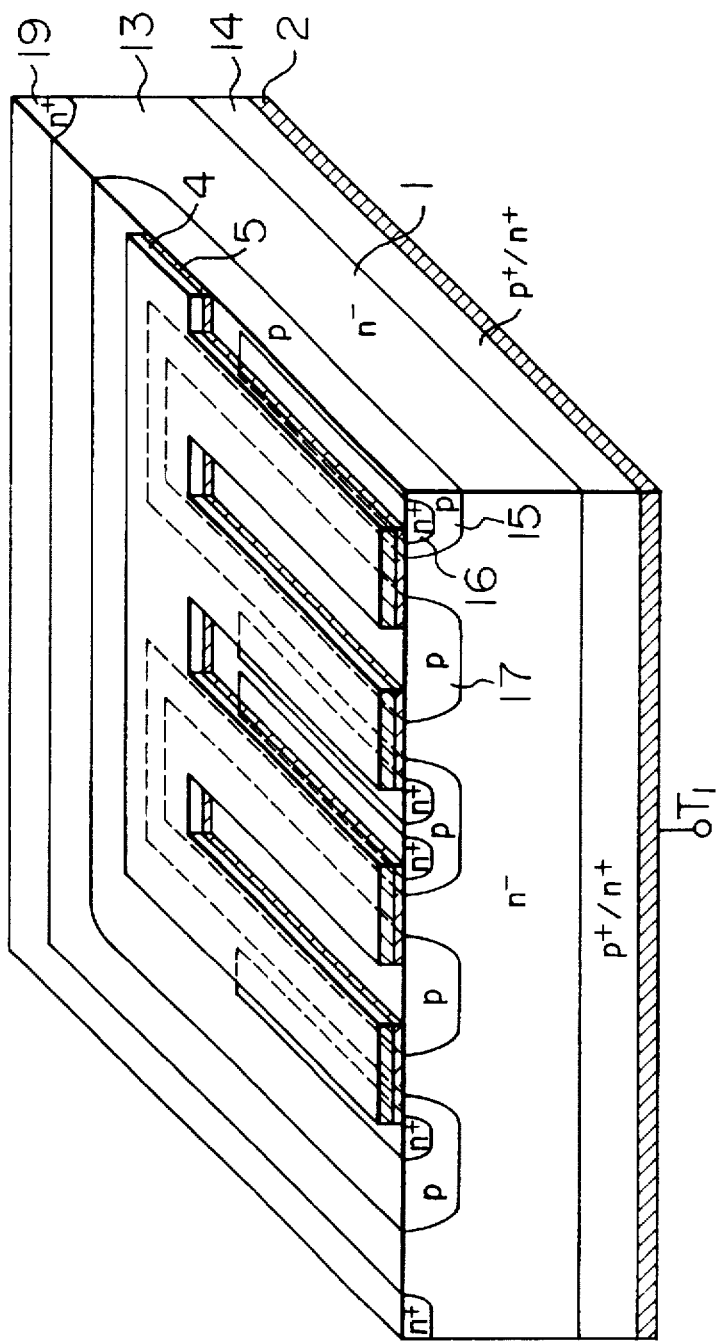
FIG. 10 is a perspective view schematically showing a composite controlled semiconductor device of the present invention.

FIG. 10 shows a perspective view of a composite controlled semiconductor device of the present embodiment. The second main electrode 3 and the auxiliary electrode 6 are omitted from FIG. 10 in order to make the illustration easy. An $n^+$ layer 19 for stopping a depletion layer extending in the first semiconductor layer 13 is formed in a periphery portion of the semiconductor body 1. The third semiconductor layers 15 (e.g., third semiconductor layer units or elemental regions) are formed from a unitized layer so that they are contiguous to each other at an outer peripheral portion. Thereby, the periphery area of the semiconductor body 1 can be fixed to the potential of the second main electrode 3 to stabilize a potential upon application of a high voltage. Each of the fifth semiconductor layers 17 is independently formed between the third semiconductor layers 15 or the fifth semiconductor layers 17 do not contact each other. The fifth semiconductor layer 17 can be biased to a higher potential than the third semiconductor layer 15, thereby making it possible to facilitate the injection of positive holes. The control electrodes 4 too are formed in a form united at the outer peripheral portion, thereby facilitating the connection thereof to the third terminal $T_3$.

Figure 11:
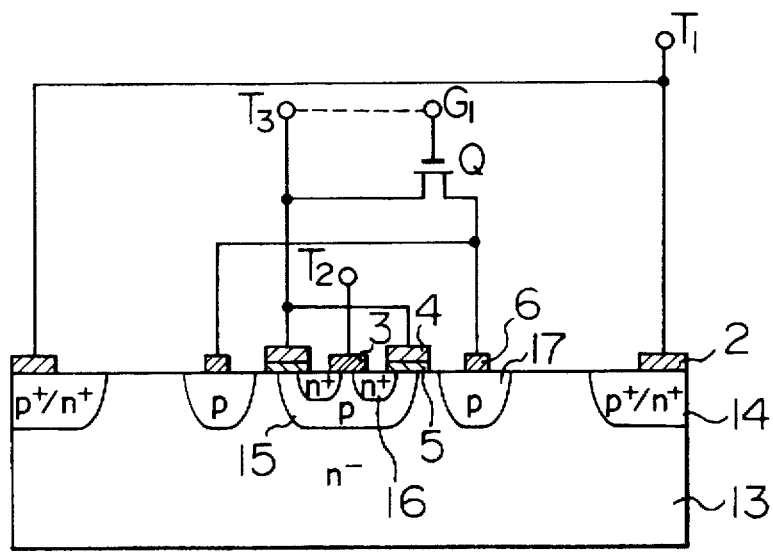
FIG. 11 is a cross-sectional view schematically showing an embodiment in the case where a composite controlled semiconductor device is applied to a lateral device.
Figure 12:
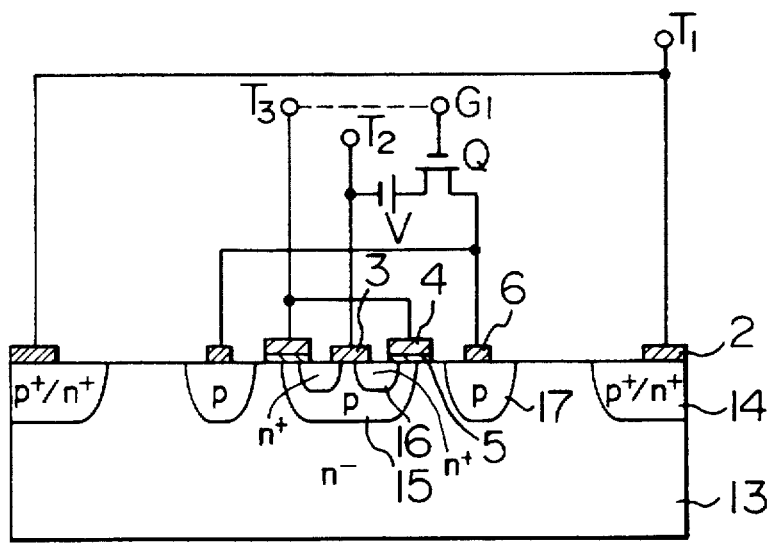
FIG. 12 is a cross-sectional view schematically showing another embodiment in the case where a composite controlled semiconductor device is applied to a lateral device.

FIGS. 11 and 12 show embodiments in the case where a composite controlled semiconductor device of the present invention is applied to a lateral device in which a current flows in a lateral direction. The first main electrode 2 is formed on the same surface as the second main electrode 3, the control electrode 4 and the auxiliary electrode 6. In this case, the fifth semiconductor layer 17 is positioned between the third semiconductor layer 15 and the second semiconductor layer 14. With this construction, though carriers injected from the second semiconductor layer 14 are extinguished before they reach the third semiconductor layer 15, the effect of the present invention can be exhibited in a similar manner to the case of the above-mentioned vertical device by virtue of the existence of the fifth semiconductor layer 17. In actual products, a large current can be derived by integrating a multiplicity of devices into a semiconductor body with the structure of FIG. 11 or 12 being taken as a unit cell. Also, the device can be integrated as one element in an integrated circuit.

Figure 13:
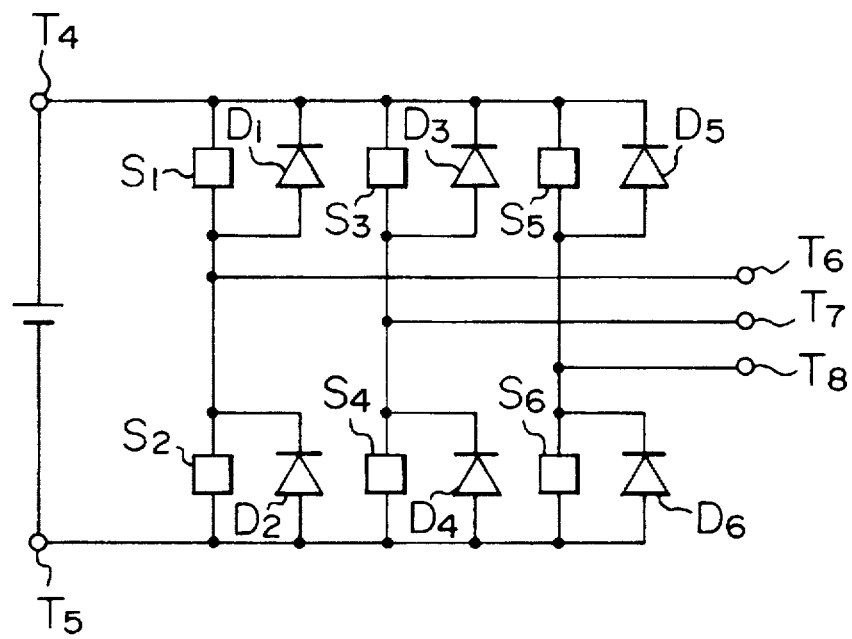
FIG. 13 is a circuit diagram showing an embodiment of a three-phase inverter using composite controlled semiconductor devices of the present invention.
Figure 14:
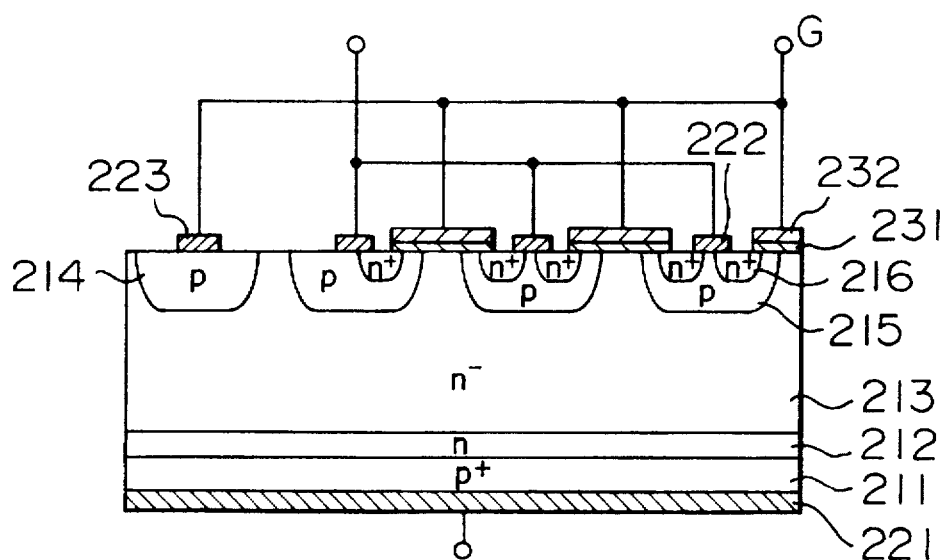
FIG. 14 is a cross-sectional view schematically showing the conventional IGBT.

FIG. 13 is a circuit diagram showing an embodiment of a three-phase inverter in which composite controlled semiconductor devices of the present invention are used. In the figure, reference symbols $T_4$ and $T_5$ designate a pair of DC terminals, symbols $S_1$ and $S_2$ (or $S_3$ and $S_4$ or $S_5$ and $S_6$) designate switching elements which are connected in series with each other and are connected between the pair of DC terminals $T_4$ and $T_5$ in parallel thereto and in the same polarity relation, symbols $D_1$, $D_2$, $D_3$, $D_4$ and $D_5$ designate diodes each connected in parallel to each switching element in a reversed polarity relation for circulating a load current, and symbols $T_6$, $T_7$ and $T_8$ designate AC terminals the number of which is the same as the number of phases of AC outputs derived from the respective junction points of the two series-connected switching elements. In the shown example, the number of AC terminals is 3. When an inverter is thus constructed by switching elements to which the present invention is applied, the number of series/parallel connections of GTO's can be decreased and the size of a cooling system can be made small since a capacity (or withstand voltage multiplied by conducting current) per one switching element becomes large and an internal loss in the switching element is reduced by virtue of a reduction in ON-state voltage. As a result, it is possible to provide an inverter which has a small size, an improved reliability and an improved controllability.

According to the present invention, since it is possible to cause a uniform conductivity modulation in the whole area of the first semiconductor layer 13 in a depth direction and a plane direction, an ON-state voltage can be reduced, for example, to about one half in the case of a 1000 V device and about one third in the case of a 2000 V device as compared with the conventional device. This means that an output current obtained is two times to three times as large as that obtained by the conventional device when it is assumed that a loss caused by the ON-state voltage is the same. Also, since it is possible to make the sum of forward current gains of respective parasitic transistors smaller than 1, a device can be protected from a breakage caused by the operation of parasitic thyristors.

I claim:

1. A composite controlled semiconductor device comprising:

a semiconductor body which has first and second principal surfaces and includes a first semiconductor layer of a first conductivity type adjoining said first principal surface, a second semiconductor layer adjoining said first semiconductor layer and said second principal surface and having a higher impurity concentration than said first semiconductor layer, a plurality of third semiconductor layers of a second conductivity type extending from said first principal surface into said first semiconductor layer and having a higher impurity concentration than said first semiconductor layer, a plurality of fourth semiconductor layers of the first conductivity type extending from said first principal surface into said third semiconductor layers and having a higher impurity concentration than said third semiconductor layers, and a plurality of fifth semiconductor layers of the second conductivity type each positioned between said third semiconductor layers, extending from said first principal surface into said first semiconductor layer and having a higher impurity concentration than said first semiconductor layer;

a first main electrode provided in ohmic contact with said second semiconductor layer on the side of said second principal surface of said semiconductor body;

a second main electrode provided in ohmic contact with said third semiconductor layers and said fourth semiconductor layers on the side of said first principal surface of said semiconductor body;

a control electrode provided through an insulating film on said first semiconductor layer, said third semiconductor layers and said fourth semiconductor layers on the side of said first principal surface of said semiconductor body; and an auxiliary electrode provided in ohmic contact with said fifth semiconductor layers on the side of said first principal surface of said semiconductor body, wherein in an ON state, a potential having a polarity for forwardly biasing each junction between said third semiconductor layers and said fourth semiconductor layers is applied between said first main electrode and said second main electrode, a potential having a polarity and a value high enough to form a channel region in a surface of each of said third semiconductor layers just under said control electrode is applied between said second main electrode and said control electrode, a potential having a polarity for forwardly biasing each junction between said fifth semiconductor layers and said first semiconductor layer is applied between said second main electrode and said auxiliary electrode, and a potential having a polarity for forwardly biasing a junction between said first semiconductor layer and said second semiconductor layer is applied between said first main electrode and said auxiliary electrode, and wherein a current limiter is provided for connecting said auxiliary electrode to one of said second main electrode and said control electrode so as to limit a current flowing into said auxiliary electrode during the ON state of the device, which limited current flow provides an injection of carriers from said fifth semiconductor layers to said first semiconductor layer.

2. A composite controlled semiconductor device comprising:

a semiconductor body which has first and second principal surfaces and includes a first semiconductor layer of a first conductivity type adjoining said first principal surface, a second semiconductor layer of the first conductivity type adjoining said first semiconductor layer and said second principal surface and having a higher impurity concentration than said first semiconductor layer, a plurality of third semiconductor layers of a second conductivity type extending from said first principal surface into said first semiconductor layer and having a higher impurity concentration than said first semiconductor layer, a plurality of fourth semiconductor layers of the first conductivity type extending from said first principal surface into said third semiconductor layers and having a higher impurity concentration than said third semiconductor layers, and a plurality of fifth semiconductor layers of the second conductivity type each positioned between said third semiconductor layers, extending from said first principal surface into said first semiconductor layer and having a higher impurity concentration than said first semiconductor layer;

a first main electrode provided in ohmic contact with said second semiconductor layer on the side of said second principal surface of said semiconductor body;

a second main electrode provided in ohmic contact with said third semiconductor layers and said fourth semiconductor layers on the side of said first principal surface of said semiconductor body;

a control electrode provided through an insulating film on said first semiconductor layer, said third semiconductor layers and said fourth semiconductor layers on the side of said first principal surface of said semiconductor body; and an auxiliary electrode provided in ohmic contact with said fifth semiconductor layers on the side of said first principal surface of said semiconductor body, wherein in an ON state, a potential having a polarity for forwardly biasing each junction between said third semiconductor layers and said fourth semiconductor layers is applied between said first main electrode and said second main electrode, a potential having a polarity and a value high enough to form a channel region in a surface of each of said third semiconductor layers just under said control electrode is applied between said second main electrode and said control electrode, a potential having a polarity for forwardly biasing each junction between said fifth semiconductor layers and said first semiconductor layer is applied between said second main electrode and said auxiliary electrode, and a potential having a polarity for forwardly biasing a junction between said first semiconductor layer and said second semiconductor layer is applied between said first main electrode and said auxiliary electrode, and wherein a current limiter is provided for connecting said auxiliary electrode to one of said second main electrode and said control electrode so as to limit a current flowing into said auxiliary electrode during the ON state of the device, which limited current flow provides an injection of carriers from said fifth semiconductor layers to said first semiconductor layer.

3. A composite controlled semiconductor device comprising:

a semiconductor body which has first and second principal surfaces and includes a first semiconductor layer of a first conductivity type adjoining said first principal surface, a second semiconductor layer of a second conductivity type adjoining said first semiconductor layer and said second principal surface and having a higher impurity concentration than said first semiconductor layer, a plurality of third semiconductor layers of the second conductivity type extending from said first principal surface into said first semiconductor layer and having a higher impurity concentration than said first semiconductor layer, a plurality of fourth semiconductor layers of the first conductivity type extending from said first principal surface into said third semiconductor layers and having a higher impurity concentration than said third semiconductor layers, and a plurality of fifth semiconductor layers of the second conductivity type each positioned between said third semiconductor layers, extending from said first principal surface into said first semiconductor layer and having a higher impurity concentration than said first semiconductor layer;

a first main electrode provided in ohmic contact with said second semiconductor layer on the side of said second principal surface of said semiconductor body;

a second main electrode provided in ohmic contact with said third semiconductor layers and said fourth semiconductor layers on the side of said first principal surface of said semiconductor body;

a control electrode provided through an insulating film on said first semiconductor layer, said third semiconductor layers and said fourth semiconductor layers on the side of said first principal surface of said semiconductor body; and an auxiliary electrode provided in ohmic contact with said fifth semiconductor layers on the side of said first principal surface of said semiconductor body, wherein in an ON state, a potential having a polarity for forwardly biasing a junction between said first semiconductor layer and said second semiconductor layer and each junction between said third semiconductor layers and said fourth semiconductor layers is applied between said first main electrode and said second main electrode, a potential having a polarity and a value high enough to form a channel region in a surface of each of said third semiconductor layers just under said control electrode is applied between said second main electrode and said control electrode, a potential having a polarity for forwardly biasing each junction between said fifth semiconductor layers and said first semiconductor layer is applied between said second main electrode and said auxiliary electrode, and a potential having a polarity for forwardly biasing a junction between said first semiconductor layer and said second semiconductor layer is applied between said first main electrode and said auxiliary electrode, and wherein a current limiter is provided for connecting said auxiliary electrode to one of said second main electrode and said control electrode so as to limit a current flowing into said auxiliary electrode during the ON state of the device, which limited current flow provides an injection of carriers from said fifth semiconductor layers to said first semiconductor layer.

4. A composite controlled semiconductor device according to claim 3, wherein said first semiconductor layer includes a first layer portion which adjoins said second semiconductor layer and a second layer portion which adjoins said third semiconductor layers and which has a lower impurity concentration than said first layer portion.

5. A composite controlled semiconductor device according to claim 2, wherein in an ON state, the sum of a current gain of a transistor formed by said first semiconductor layer, said third semiconductor layers and said fourth semiconductor layers and a current gain of a transistor formed by said fifth semiconductor layers, said first semiconductor layer and said third semiconductor layers is smaller than 1.

6. A composite controlled semiconductor device according to claim 3, wherein in an ON state, the sum of a current gain of a transistor formed by said first semiconductor layer, said third semiconductor layers and said fourth semiconductor layers, a current gain of a transistor formed by said second semiconductor layer, said first semiconductor layer and said third semiconductor layers and a current gain of a transistor formed by said fifth semiconductor layers, said first semiconductor layer and said third semiconductor layers is smaller than 1.

7. A composite controlled semiconductor device according to claim 6, wherein said first semiconductor layer includes a first layer portion which adjoins said second semiconductor layer and a second layer portion which adjoins said third semiconductor layers and which has an impurity concentration lower than said first layer portion.

8. A composite controlled semiconductor device according to claim 1, wherein a voltage between said first main electrode and said second main electrode in an OFF state is higher than 1000 V and a voltage between said first main electrode and said second main electrode in an ON state is smaller than 2.0 V.

9. A composite controlled semiconductor device comprising:

a semiconductor body including a first semiconductor layer of a first conductivity type, a second semiconductor layer adjoining said first semiconductor layer and having a higher impurity concentration than said first semiconductor layer, at least one third semiconductor layer of a second conductivity type extending from a main surface of said semiconductor body into said first semiconductor layer and having a higher impurity concentration than said first semiconductor layer, a plurality of fourth semiconductor layers of the first conductivity type extending into said at least one third semiconductor layer from the main surface of said semiconductor body and having a higher impurity concentration than said at least one third semiconductor layer, and at least one fifth semiconductor layer of the second conductivity type spaced apart of both said second semiconductor layer and said third semiconductor layer, extending from the main surface of said semiconductor body into said first semiconductor layer and having a higher impurity concentration than said first semiconductor layer;

a first main electrode provided in ohmic contact with said second semiconductor layer;

a second main electrode provided in ohmic contact with said at least one third semiconductor layer and said fourth semiconductor layers;

a control electrode provided through an insulating film on said first semiconductor layer, said at least one third semiconductor layer and said fourth semiconductor layers; and an auxiliary electrode provided in ohmic contact with said at least one fifth semiconductor layer, wherein in an ON state, a potential having a polarity for forwardly biasing each junction between said at least one third semiconductor layer and said fourth semiconductor layers is applied between said first main electrode and said second main electrode, a potential having a polarity and an amplitude high enough to form a channel region at a surface of said at least one third semiconductor layer, just under said control electrode, is applied between said second main electrode and said control electrode, a potential having a polarity for forwardly biasing a junction between said at least one fifth semiconductor layer and said first semiconductor layer is applied between said second main electrode and said auxiliary electrode, and a potential having a polarity for forwardly biasing a junction between said first semiconductor layer and said second semiconductor layer is applied between said first main electrode and said auxiliary electrode, and wherein a current limiter is provided for connecting said auxiliary electrode to one of said second main electrode and said control electrode so as to limit a current flowing into said auxiliary electrode during the ON state of the device, which limited current flow provides an injection of carriers from said at least one fifth semiconductor layer to said first semiconductor layer.

10. A composite controlled semiconductor device according to claim 1, wherein said current limiter is selected from the group consisting of a resistor, a transistor, a series circuit of said transistor and a diode, and a DC power supply.

11. A composite controlled semiconductor device according to claim 2, wherein said current limiter is selected from the group consisting of a resistor, a transistor, a series circuit of said transistor and a diode, and a DC power supply.

12. A composite controlled semiconductor device according to claim 3, wherein said current limiter is selected from the group consisting of a resistor, a transistor, a series circuit of said transistor and a diode, and a DC power supply.

13. A composite controlled semiconductor device according to claim 1, wherein said plurality of third semiconductor layers are, respectively, extended in parallel as separate unit layers from a common semiconductor layer.

14. A composite controlled semiconductor device according to claim 2, wherein said plurality of third semiconductor layers are, respectively, extended in parallel as separate unit layers from a common semiconductor layer.

15. A composite controlled semiconductor device according to claim 3, wherein said plurality of third semiconductor layers are, respectively, extended in parallel as separate unit layers from a common semiconductor layer.

16. A composite controlled semiconductor device according to claim 1, wherein said control electrode is also provided, through said insulating film, on said fifth semiconductor layers.

* * * * *